United States Patent
He et al.

(10) Patent No.: US 7,087,883 B2
(45) Date of Patent: *Aug. 8, 2006

(54) CMOS IMAGE SENSOR USING SHARED TRANSISTORS BETWEEN PIXELS WITH DUAL PINNED PHOTODIODE

(75) Inventors: Xinping He, San Jose, CA (US); Hongli Yang, Cupertino, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 10/771,839

(22) Filed: Feb. 4, 2004

(65) Prior Publication Data

US 2005/0167574 A1    Aug. 4, 2005

(51) Int. Cl.
*H01J 40/14*    (2006.01)
(52) U.S. Cl. .............................. 250/214 R; 250/208.1
(58) Field of Classification Search ............ 250/214 R, 250/208.1
See application file for complete search history.

(56) References Cited

U.S. PATENT DOCUMENTS

| 4,809,075 | A | 2/1989 | Akimoto et al. | |
|---|---|---|---|---|
| 5,955,753 | A | 9/1999 | Takahashi | |
| 6,160,281 | A | 12/2000 | Guidash | |
| 6,218,691 | B1 * | 4/2001 | Chung et al. | 257/290 |
| 6,320,617 | B1 * | 11/2001 | Gee et al. | 348/302 |
| 6,750,912 | B1 | 6/2004 | Tennant et al. | |

FOREIGN PATENT DOCUMENTS

| EP | 0707417 | 4/1996 |
|---|---|---|
| JP | 63-267144 | 10/1988 |
| JP | 11331713 | 11/1999 |
| WO | WO01/10117 | 2/2001 |

OTHER PUBLICATIONS

Takahashi, Hidekazu, et al. "A 3.9 um Pixel Pitch VGA Format 10b Digital Output CMOS Image Sensor with 1.5 Transistors/Pixel." New York: *IEEE Journal of Solid-State Circuits*, vol. 39, No. 12, Dec. 2004, pp. 2417-2425.

Mabuchi et al. "CMOS Image Sensor Using a floating Diffusion Driving Buried Photodiode" New York; *IEEE Journal of Solid-State Circuits*, vol. 39, No. 12, Dec. 2004, pp. 2408-2416.

* cited by examiner

*Primary Examiner*—Que T. Le
(74) *Attorney, Agent, or Firm*—Perkins Coie LLP

(57) ABSTRACT

A CMOS image sensor that has reduced transistor count is disclosed. The individual pixels are formed by a pinned photodiode and a transfer transistor. An output node receives the signal from the photodiode via the transfer transistor. The output node is shared between multiple pixels. Further, a reset transistor is coupled between a selectable low voltage rail $V_{ss}$ or a high voltage reference $V_{ref}$ and the output node. The gate of an output transistor is then coupled to the output node. Both the reset transistor and output transistors are shared between multiple pixels.

13 Claims, 4 Drawing Sheets

CMOS IMAGE SENSOR USING SHARED TRANSISTORS BETWEEN PIXELS WITH DUAL PINNED PHOTODIODE

TECHNICAL FIELD

The present invention relates to CMOS image sensors, and more particularly, to a CMOS image sensor having a pixel architecture that allows for sharing of output transistors during readout.

BACKGROUND

Integrated circuit technology has revolutionized various fields, including computers, control systems, telecommunications, and imaging. In the field of imaging, complimentary metal oxide semiconductor (CMOS) active pixel image sensors have made considerable inroads into applications served by charge coupled imaging devices. As noted in U.S. Pat. No. 5,625,210 to Lee et al. ("the '210 patent"), an active pixel sensor refers to an electronic image sensor with active devices, such as transistors, that are associated with each pixel. The active pixel sensor has the advantage of being able to incorporate both signal processing and sensing circuitry within the same integrated circuit because of the CMOS manufacturing techniques.

One common design for an active pixel is the basic, three-transistor CMOS active pixel which contains a photodiode; a reset transistor for resetting the photodiode voltage, a source follower for amplification, and a row select transistor for buffering the photodiode voltage onto a vertical-column bus. However, the three-transistor pixel is lacking in its ability to suppress noise due to the reset operation, referred to as kTC noise. Further, the three-transistor pixel does not have good response to blue light.

Another popular active pixel sensor structure consists of four transistors and a pinned photodiode. The pinned photodiode has gained favor for its ability to have good color response for blue light, as well as advantages in dark current density and image lag. Reduction in dark current is accomplished by "pinning" the diode surface potential to the Pwell or Psubstrate (GND) through a P+ region. Because of the particular characteristics of pinned photodiodes, it is necessary to incorporate a transfer transistor that is not required in the three-transistor design discussed above.

Still, one disadvantage of the pinned photodiode is that it requires four transistors for each pixel. Thus, a one-megapixel image sensor would require 4 million transistors simply for the imaging array. As higher resolution image sensors become popular, coupled with the need for higher integration densities, it is desirable to implement the pinned photodiode pixel while limiting the number of required transistors.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

The present invention relates to an active pixel design using a pinned photodiode that requires fewer than an average of four transistors per active pixel. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
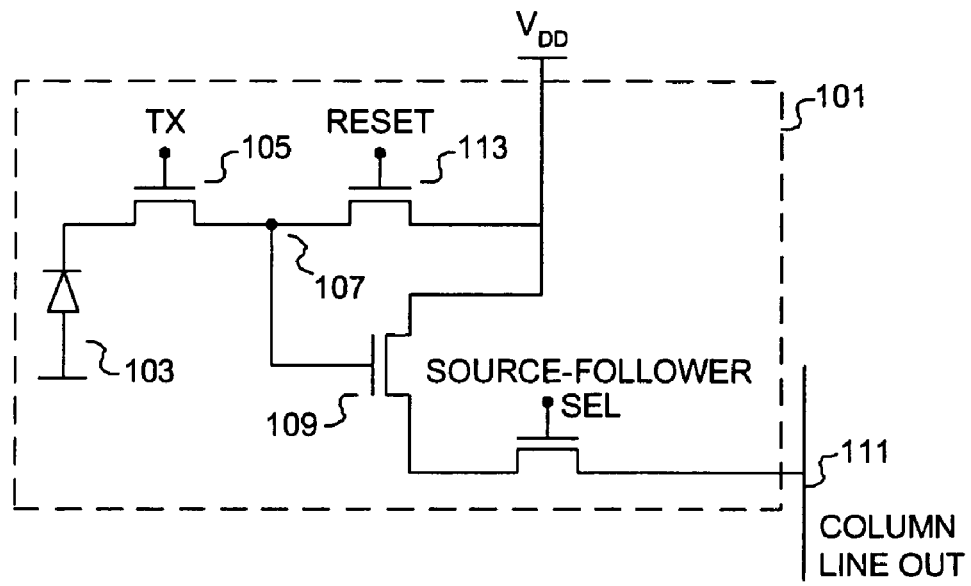
FIG. 1 is a schematic diagram of a prior art active pixel.
Figure 2:
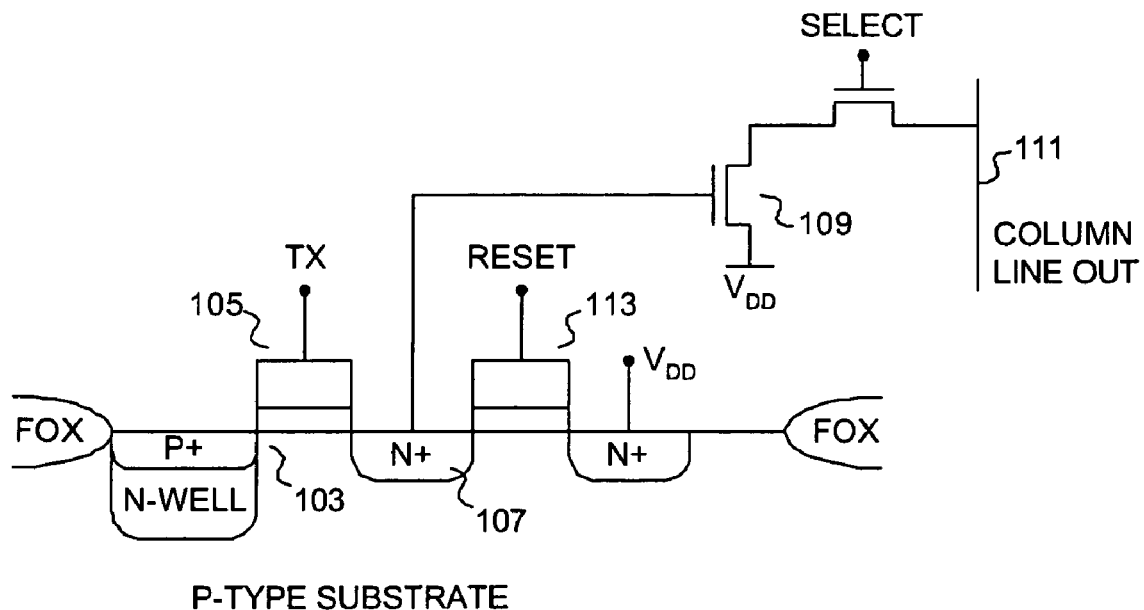
FIG. 2 is a cross section view of the prior art active pixel of FIG. 1.

FIGS. 1 and 2 show a prior art active pixel 101 with pinned photodiode 103. The pinned photodiode 103 is typically an N-well formed in a P-type substrate. A P+ region is formed atop of the N-well. A transfer gate (also referred to as a transfer transistor) controls the transfer of the signal from the pinned photodiode 103 to an output node 107. The output node 107 is connected to the gate of a source-follower transistor 109 (also referred to as a drive or output transistor). This results in the signal on the output node 107 being amplified and placed onto the column line out 111. A row select transistor (SEL) is used to select the particular pixel to be read out on the column line out 111. The row select transistor is controlled by a row select line. Further, a reset transistor 113 is used to deplete the signal from the sensing node. In order to reduce the leakage current from the silicon surface and kTC noise, the photodiode is typically provided with a pinning P+ surface shield layer at the silicon surface and is completely depleted.

Figure 3:
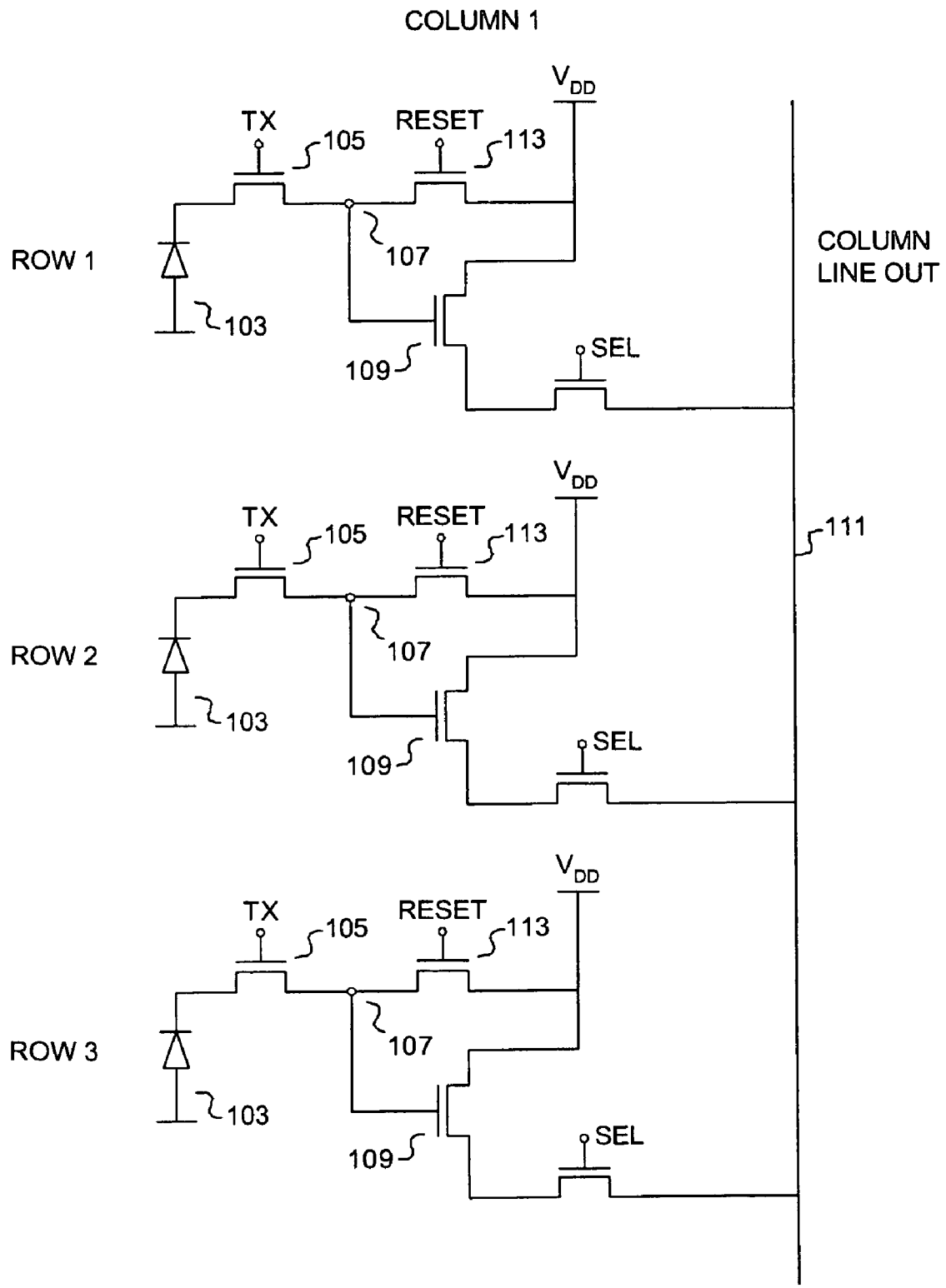
FIG. 3 is a schematic diagram of a portion of a column of a prior art image sensor array.

FIG. 3 illustrates a portion of a column from a sensor array using pinned photodiode pixels. In the illustration, column one of the array is shown and the first three rows of the array are shown. As seen, a column line out 111 carries the signals from the rows to readout circuitry (not shown). The row select (SEL) transistors for each pixel are selectively activated one at a time to read out the pixel signals. As seen, for three pixels, twelve transistors are required. Extrapolated out, a one megapixel array would require four million transistors for the imaging array.

The present invention can reduce the amount of transistors required to implement a pinned photodiode sensor array. This reduction is made possible by sharing the source follower transistor 109 and reset transistor between two or more adjacent rows of pixels. This sharing of transistors will reduce greatly the overall number of transistors required to implement a pinned photodiode image sensor.

Figure 4:
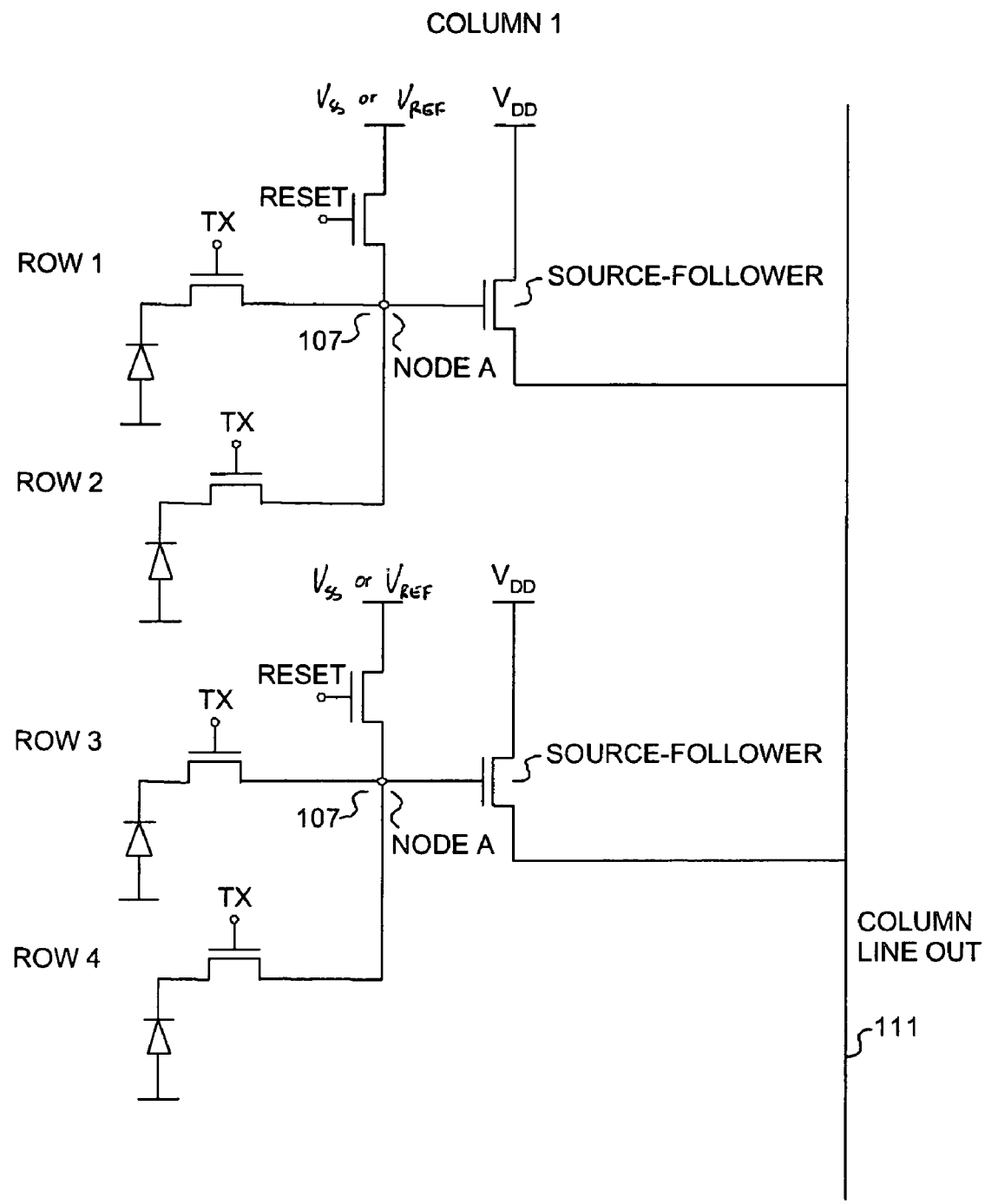
FIG. 4 is a schematic diagram of a portion of a column of an imaging array formed in accordance with the present invention.

Specifically, turning to FIG. 4, a portion of an imaging array is shown. This specific portion shows a single column (Column 1) and four rows. In contrast to the prior art, note that adjacent pixels in rows 1 and 2 share a source follower and a reset transistor. Similarly, adjacent pixels in rows 3 and 4 share a source follower and reset transistor. Further, note that in accordance with the present invention there is no row select transistor needed. Instead, the drain of the source follower transistor is connected directly to the column line out 111. Thus, the total number of transistors required for these four pixels is eight. Therefore, on average, each pixel requires only two transistors. This is a significant savings from the four transistors for each pixel in the prior art of FIG. 3.

Further, while it is shown that two pixels share a common reset transistor and source follower transistor, this can be increased to perhaps three or even four pixels in a column for greater transistor savings. However, in the embodiment shown in FIG. 4, two pixels in adjacent rows share the reset transistor and source follower transistor.

Moreover, the reset transistor has its upper connection (the drain) connected to either a low voltage $V_{ss}$ or a high voltage reference $V_{ref}$. As will be seen below, the reset transistor will place either $V_{ss}$ or $V_{ref}$ onto node A as appropriate for the operation of the present invention. The actual switching between $V_{ss}$ or $V_{ref}$ can be easily done using a simple control switch (not shown) as is apparent to those of ordinary skill in the art.

The output node 107 (also referred to Node A) thus is shared between two pixels. The operation of the present invention is explained as follows. When the signal from row 1 is to be read out, the reset transistor is turned on to allow high voltage reference $V_{ref}$ to be placed on node A. The other node A's for all of the other rows are placed at voltage $V_{ss}$ through their respective reset transistors. Thus, only node A associated with the row to be read is at high voltage, while all of the other node A's for the other rows are at low voltage.

Next, the reset transistor for the row to be read is turned off and the transfer gate for the row is turned on. The accumulated charge from the photodiode is then transferred to Node A and, along with the high voltage already placed on node A, will modulate the source follower transistor. The transfer gate for the adjacent row pixel (row 2) is off at this time. Thus, the signal produced by the photodiode of the pixel in row 1 modifies the high voltage "base point" and is then amplified by the source follower and the signal is provided onto the column line output 111.

Once this has been done, the reset transistor drain voltage is switched over to low and the reset transistor is turned on. This resets node A to the low reference voltage, such as $V_{ss}$.

For reading of the next row (Row 2), the procedure is repeated where the reset transistor places a high voltage onto Node A and then turning on the transfer gate for row 2 is turned on and the signal from the photodiode of the row 2 pixel is transferred to the output node 107 to mix with the high voltage.

At this time, the transfer gate for the row 1 pixel is turned off. The signal on the output node 107 from the row 2 pixel is then amplified by the source follower and the signal is output via the column line out 111. Note that during the read out of rows 1 and 2, Node A of rows 3 and 4 (and all other rows) are held at a low voltage reference, such as $V_{ss}$, by turning on the reset transistors for those rows and keeping the reset transistors' drain voltage at low.

The process of reading the remaining rows of the image sensor are the same as for as for rows 1 and 2. At any one instant in time, only one of the row select transistors is turned on.

In one actual embodiment, the transistors that form the reset transistor, the source follower transistor, and the row select transistor for a grouping of rows is typically formed in those areas of the imaging array that are outside of the actual photodiode and transfer gate pixel area. This will increase the fill factor of the pixel and provide additional balancing to the operation of the read out circuit.

Figure 5:
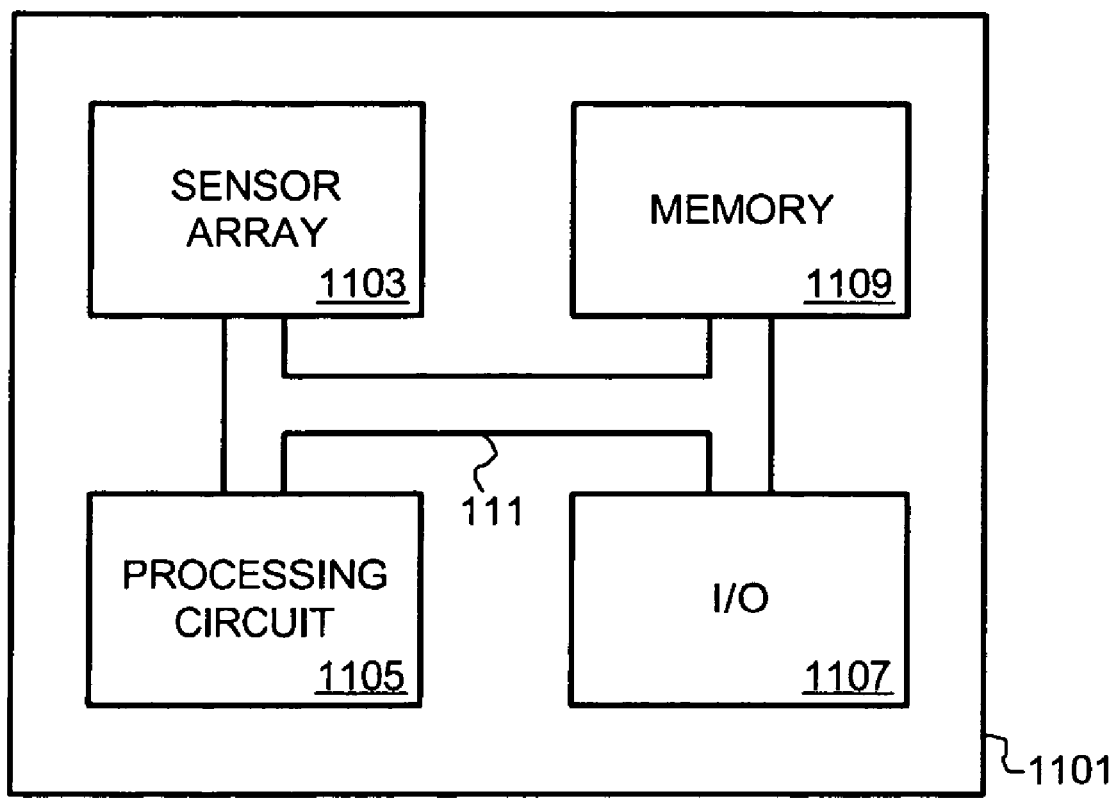
FIG. 5 is a block diagram of a CMOS image sensor formed in accordance with the present invention.

The active pixels described above may be used in a sensor array of a CMOS image sensor 1101. Specifically, FIG. 5 shows a CMOS image sensor formed in accordance with the present invention. The CMOS image sensor includes a sensor array 1103, a processor circuit 1105, an input/output (I/O) 1107, memory 1109, and bus 1111. Preferably, each of these components is formed on a single N-type semiconductor silicon substrate and manufactured to be integrated onto a single chip using standard CMOS processes.

The sensor array 1103 portion may be, for example, substantially similar to the sensor arrays portions of image sensors manufactured by the assignee of the present invention, OmniVision Technologies, Inc., of Sunnyvale, Calif., as model numbers OV7630, OV7920, OV7930, OV9620, OV9630, OV6910, or OV7640, except that the pixels are replaced with the active pixels disclosed herein.

More specifically, the sensor array 1103 includes a plurality of individual pixels arranged in a two-dimensional array. In operation, as an image is focused onto the sensor array 1103, the sensor array 1103 can obtain the raw image data.

The raw image data is then received by the processor circuit 1105 via bus 1111 to begin signal processing. The processor circuit 1105 is capable of executing a set of preprogrammed instructions (perhaps stored in memory 1107) necessary to carry out the functions of the integrated circuit 1101. The processor circuit 1105 may be a conventional microprocessor, DSP, FPGA or a neuron circuit.

While the preferred embodiment of the invention has been illustrated and described, it will be appreciated that various changed can be made therein without departing from the spirit and scope of the invention.

The present invention has thus been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the letters patent granted hereon be limited only by the definitions contained in appended claims and equivalents thereof, and not by limitations of the embodiments described herein.

We claim:

1. An apparatus comprising:
   a first pinned photodiode formed in a semiconductor substrate;
   a first transfer transistor placed between the first pinned photodiode and an output node, the combination of said first pinned photodiode and first transfer transistor forming a first light sensing pixel;
   a second pinned photodiode formed in said semiconductor substrate;
   a second transfer transistor placed between the second pinned photodiode and said output node, the combination of said second pinned photodiode and second transfer transistor forming a second light sensing pixel;
   a reset transistor coupled between a voltage reference and the output node; and
   an output transistor that is coupled to the output node.

2. The apparatus of claim 1 wherein the voltage reference is selectable between a low voltage reference $V_{ss}$ or high voltage reference $V_{ref}$.

3. The apparatus of claim 1 wherein said first light sensing pixel is in a first row of an imaging array and said second light sensing pixel is in a second row of an image array adjacent to said first row.

4. The apparatus of claim 1, wherein the output transistor is connected to a column line out without the use of a row select transistor.

5. The apparatus of claim 1, further including:
   a third pinned photodiode formed in said semiconductor substrate;
   a third transfer transistor placed between the third pinned photodiode and said output node, the combination of said third pinned photodiode and third transfer transistor forming a third light sensing pixel.

6. The apparatus of claim 1, wherein said reset transistor is operative to reset said output node to a low voltage prior to transferring a signal from either said first or second photodiode.

7. The apparatus of claim 1, wherein said output transistor has its gate coupled to said output node.

8. A CMOS sensing array comprising:
   a plurality of pixels arranged in rows and columns formed in a semiconductor substrate each comprising:
   (a) a pinned photodiode;
   (b) a transfer transistor for transferring a signal out from the pinned photodiode;
   a plurality of output nodes, each of said output nodes shared between at least two of said pixels and for receiving said signal from said at least two of said pixels;
   a plurality of reset transistors associated with said plurality of output nodes, each of said reset transistors shared between said at least two of said pixels and coupled between a voltage reference and an associated output node; and
   a plurality of output transistors associated with said plurality of output nodes, each of said output transistors shared between said at least two of said pixels, the gate of the output transistor being coupled to the associated output node.

9. The apparatus of claim 8 wherein the voltage reference is selectable between a low voltage reference $V_{ss}$ or high voltage reference $V_{ref}$.

10. The imaging array of claim 8 further including a processing circuit for receiving the output of said output transistors.

11. The imaging array of claim 10 further including an I/O circuit for outputting the output of said output transistors pixels off of said CMOS image sensor.

12. The imaging array of claim 9 wherein said output nodes share pixels that are from adjacent rows from the same column.

13. The imaging array of claim 9 wherein the output transistors are connected to a column line out without the use of a row select transistor.

* * * * *